United States Patent
Slaughter et al.

(10) Patent No.: US 9,455,015 B2
(45) Date of Patent: Sep. 27, 2016

(54) HIGH TEMPERATURE DATA RETENTION IN MAGNETORESISTIVE RANDOM ACCESS MEMORY

(71) Applicant: Everspin Technologies, Inc., Chandler, AZ (US)

(72) Inventors: Jon Slaughter, Chandler, AZ (US); Jason Allen Janesky, Gilbert, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/879,061

(22) Filed: Oct. 8, 2015

(65) Prior Publication Data

US 2016/0104519 A1 Apr. 14, 2016

Related U.S. Application Data

(60) Provisional application No. 62/062,697, filed on Oct. 10, 2014.

(51) Int. Cl.
*G11C 11/00* (2006.01)
*G11C 11/16* (2006.01)
*G11C 13/00* (2006.01)

(52) U.S. Cl.
CPC ............ *G11C 11/1675* (2013.01); *G11C 11/16* (2013.01); *G11C 11/1673* (2013.01); *G11C 13/0002* (2013.01); *G11C 13/0097* (2013.01)

(58) Field of Classification Search
CPC .......... G11C 13/0002; G11C 13/0097; G11C 13/0069; G11C 11/16; G11C 11/1673; G11C 11/1675
USPC .................................... 365/158, 171, 189.16
See application file for complete search history.

(56) References Cited

U.S. PATENT DOCUMENTS

| | | | |
|---|---|---|---|
| 6,324,093 B1 | 11/2001 | Perner et al. | |
| 7,532,533 B2 * | 5/2009 | Andre | G11C 17/18 365/158 |
| 8,659,028 B2 * | 2/2014 | Scheuerlein | G11C 7/18 257/390 |
| 2004/0003191 A1 * | 1/2004 | Minne | G06F 3/0616 711/163 |
| 2005/0036362 A1 | 2/2005 | Iwata et al. | |
| 2006/0049441 A1 | 3/2006 | Janesky et al. | |
| 2010/0195380 A1 * | 8/2010 | Wang | B82Y 25/00 365/171 |
| 2011/0032744 A1 * | 2/2011 | Ohmori | G11C 11/16 365/145 |
| 2014/0057372 A1 | 2/2014 | Ritenour | |

OTHER PUBLICATIONS

International Searching Authority, International Search Report and Written Opinion mailed Dec. 30, 2015 for International Application No. PCT/US2015/000112.

* cited by examiner

*Primary Examiner* — Gene Auduong (57) ABSTRACT

Techniques and circuits for storing and retrieving data using spin-torque magnetic memory cells as anti-fuses are presented. Circuits are included to allow higher-magnitude voltages and currents to be applied to magnetic memory cells to intentionally break down the dielectric layer included the magnetic tunnel junction. Magnetic memory cells having a normal-resistance magnetic tunnel junction with an intact dielectric layer are used to store a first data state, and magnetic memory cells having a magnetic tunnel junction with a broken-down dielectric layer are used to store a second data state. Data can be stored in such a manner during wafer probe and then later read out directly or copied into other magnetic or non-magnetic memory on the device for use in operations after the device is included in a system.

20 Claims, 5 Drawing Sheets

HIGH TEMPERATURE DATA RETENTION IN MAGNETORESISTIVE RANDOM ACCESS MEMORY

CROSS REFERENCE TO RELATED APPLICATIONS

This application claims priority to U.S. Provisional Application No. 62/062,697 filed Oct. 10, 2014. The content of that provisional application is incorporated by reference herein in its entirety.

TECHNICAL FIELD

The disclosure herein relates generally to magnetoresistive memory devices and circuitry and techniques for storing data in magnetic memory cells in a manner that supports high-temperature data retention.

BACKGROUND

In normal operation, magnetic memory cells such as spin-torque magnetic memory cells store data in magnetic tunnel junctions based on the magnetic orientation of a free portion relative to a fixed portion, the free and fixed portions being separated by a tunnel barrier. In-plane and perpendicular embodiments are known in the art and refer to the orientations of the magnetic easy axes of free and fixed layers relative to the memory device film plane. In such memory cells, the voltage drop across a magnetic tunnel junction (MTJ) in each memory cell can be varied based on the relative magnetic states of the ferromagnetic layers within the MTJ device. Because the resistance through the memory cell changes based on the magnetic orientation of the free portion, information can be stored by setting the orientation of the free portion. The information is later retrieved by sensing the orientation of the free portion which is indicated by the resistance across the memory cell.

Writing to spin-torque magnetic memory cells is accomplished by passing a write current through the MTJ device where the angular momentum carried by the spin-polarized tunneling current can change the magnetic state of the free portion. Depending on the direction of the current through the MTJ device, the resulting magnetization of the free portion will either be in a first state or a second state relative to the fixed portion. In some spin torque devices, the first and second states correspond to the free portion magnetization being parallel to the fixed portion magnetization and anti-parallel to the fixed portion magnetization, respectively. If the parallel orientation represents a logic "0", the antiparallel orientation represents a logic "1", or vice versa. Thus, the direction of write current flow through the MTJ device determines whether the memory cell is written to a first state or a second state. In such memories, the magnitude of the write current is typically greater than the magnitude of a read current used to sense the information stored in the memory cells.

In some applications, it is useful to store a set of data in memory cells during manufacturing. For example, it may be desirable to store security codes or boot-up software on an integrated circuit during manufacturing so it can later be used when the integrated circuit is included in a system. However, because the data retention ability of magnetic memory cells is adversely affected by high temperatures, later manufacturing steps that include high-temperature operations (e.g. packaging and soldering) that can cause normal magnetic memory cells to lose any data stored in those cells prior to such high-temperature operations. Similarly, exposure to strong magnetic fields after being programmed to a particular state during manufacturing can also result in data loss. As such, there is a need for techniques and circuitry to support the storage and retrieval of data in spin-torque magnetic memory cells in a manner that is less susceptible to exposure to high temperatures or external magnetic fields.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to improve understanding of the example embodiments.

The terms "comprise," "include," "have" and any variations thereof are used synonymously to denote non-exclusive inclusion. The term "exemplary" is used in the sense of "example," rather than "ideal." During the course of this description, like numbers may be used to identify like elements according to the different figures that illustrate the various exemplary embodiments.

In the interest of conciseness, conventional techniques, structures, and principles known by those skilled in the art may not be described herein, including, for example, standard magnetic random access memory (MRAM) operation, fundamental principles of magnetism, and basic operational principles of memory devices. Similarly, conventional techniques related to reading and writing data in memory cells, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Nonvolatile memory devices such as spin-torque magnetoresistive random access memory (ST-MRAM) cells are often used to store data that remains valid after power is no longer applied. In some embodiments, it is desirable to store data in such memory cells during manufacturing for later use when the integrated circuit on which the memory cells are included is placed in a system-level environment. For example, data can be stored in the memory cells during wafer-probe, and after the die (chip) on which the memory cells are included is packaged and soldered onto a printed circuit board, that data can be used by the system for various operations. When a magnetic memory device stores data using the magnetic orientation of the free layer, the ability of the device to retain data can be compromised by the heat associated with manufacturing operations such as wave-soldering used to mount integrated circuits to printed circuit board. As such, storing the data in such memory cells using conventional means may not provide the reliability needed for many applications.

As described herein, rather than programming the memory cells using conventional writing techniques that force the magnetic moment of the free portion into a particular orientation relative to the fixed portion, memory cells can be used to store data by either leaving their magnetic tunnel junctions intact or by intentionally causing breakdown of the dielectric layer in the magnetic tunnel junction. Functioning magnetic tunnel junctions exhibit a resistance much greater than the resistance than those for which the dielectric layer has been compromised. Thus, a first state can be stored by leaving the magnetic tunnel junction for a memory cell intact, while a second state can be stored by intentionally causing dielectric breakdown of the tunnel barrier. In such an embodiment, the magnetic memory cells behave as anti-fuses, thereby providing data storage not susceptible to disturbance by heat or external magnetic fields.

As described in more detail below, the magnetic memory cells used to store data in this manner can either be the same in structure as the magnetic memory cells on the device used to store data in a conventional manner, or the memory cells can be different in size or structure to further facilitate their role in data storage. As used herein, "same size" and "same construction" should be understood to include slight variations such as those that normally occur in manufacturing operations. In one example, while manufactured using the same processing steps, the memory cells intended to store data based on a functional/non-functional magnetic tunnel junction may be larger in size than memory cells used to store data in the conventional manner. The larger size reduces the voltage required to achieve dielectric breakdown of the tunnel barrier. Embodiments are also presented in which the circuitry used to convey the switching current to the MTJ is configured to support the additional current needed to cause break down of the dielectric tunnel barrier layer in the MTJ. For example, select transistors used to access those memory devices can be oversized to allow for additional current-carrying capacity. In other embodiments, multiple select transistors can be coupled together in parallel to provide increased current-carrying capabilities.

In yet other embodiments, rather than storing data based on a normal/abnormal resistance of a magnetic tunnel junction in memory cells, specialty magnetic memory cells can be included on the integrated circuit that provide better data retention at higher temperatures. For example, such devices may be patterned to be larger in order to increase their energy barrier such that data is less likely to be lost by the memory cells when exposed to high temperatures such as those employed during packaging or wave-soldering operations. In such an embodiment, the same process steps may be used to form the high-temperature tolerant memory cells. In other embodiments, the memory cells employ different magnetic materials or processing steps in order to increase their data retention abilities. In one example embodiment, multiple magnetic tunnel junctions can be used to store the data intended to survive the high temperature operations. The multiple magnetic tunnel junctions can be in the same memory cell or distributed amongst multiple memory cells. In yet other embodiments, data is stored on the integrated circuit based on the inclusion/exclusion of certain device features in the memory cells (e.g. the presence or absence of a MTJ). While such an embodiment may require a specific mask that encodes the data to be stored just as a standard Read Only Memory (ROM) requires, it may utilize the same processing and read/write circuitry already present on the integrated circuit used for the magnetic memory cells storing data in the conventional manner.

Figure 1:
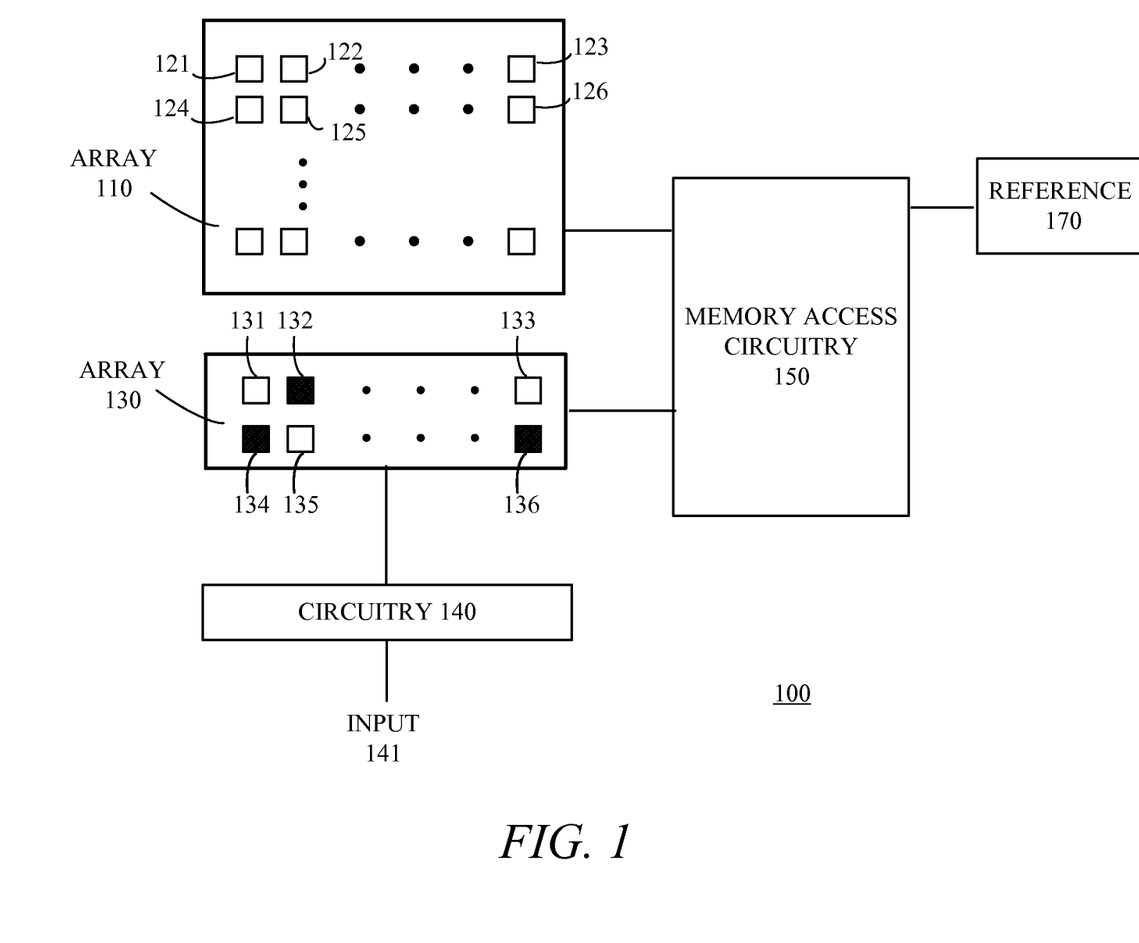
FIG. 1 is block diagram of an integrated circuit device in accordance with an exemplary embodiment.

FIG. 1 illustrates a block diagram of an integrated circuit device 100 that includes magnetic memory cells 121-126 that function as normal read/write magnetic memory cells during normal device operation. Device 100 also includes magnetic memory cells 131-136 that are specifically designed and operated to be tolerant of high temperatures and externally applied magnetic fields. As discussed above, the memory cells 131-136 can store data in an anti-fuse configuration where a blown magnetic tunnel junction (i.e. the dielectric layer has broken down) represents a first value and a functional tunnel junction represents a second value. In other embodiments, the memory cells 131-136 may have a different configuration or structure than makes them more tolerant of heat or external magnetic fields (e.g. sized larger, different magnetic materials, etc.).

As shown in FIG. 1, the magnetic memory cells configured to store data in a normal manner are included in a first array 110, while the magnetic memory cells 131-136 are included in a second array 130. In other embodiments, the magnetic memory cells 131-136 may be included in the same array as the memory cells 121-126. In such embodiments, the magnetic memory cells 131-136 may be included in dedicated rows or columns in the shared array in order to allow access to those cells using circuitry adapted to support the high-current programming that may be needed to store data in those memory cells. In the array 130, memory cells 131, 133, and 135 are intact magnetic memory cells having a magnetic tunnel junction with a normal resistance, whereas memory cells 132, 134, and 136 are broken down magnetic memory cells that have a dielectric tunnel barrier layer that has broken down and is no longer functional as a tunnel barrier. The resistance of the broken-down memory cells is significantly lower than that of the intact magnetic memory cells because the dielectric layer no longer serves as a tunnel barrier but instead forms a typical resistive connection between the free and fixed portions.

In some embodiments, the magnetic memory cells 131-136 have the same size and construction as the memory cells 121-126. Thus the same processing steps, patterning, and materials can be used to form both sets of memory cells such that the memory cells consist of features formed using common processing steps and materials. In other embodiments, while the same processing steps and materials may be used to form memory cells 131-136 and memory cells 121-126, the memory cells 131-136 are formed to have reduced breakdown characteristics in comparison with the memory cells 121-126. In other words, the memory cells 131-136 may be formed in a manner that makes their tunnel junctions more susceptible to breakdown when a large current is applied through, or a high voltage is applied across, their respective tunnel junctions. For example, in one embodiment the magnetic memory cells 131-136 are larger than the magnetic memory cells 121-126 in order to reduce the breakdown voltage of the magnetic memory cells 131-136 relative to the memory cells 121-126. In some embodiments, the characteristics of memory cells 131-136 are tailored to improve their breakdown characteristics in view of the programming tools available when breakdown is to occur. For example, if data is stored in memory cells 131-136 during wafer probe or other testing operations, higher voltages may be available than are present during normal operation. Similarly, heat and external magnetic fields can be applied during such testing operations, thereby making it easier to break down the tunnel junctions and store data in the memory cells 131-136.

As shown in FIG. 1, circuitry 140 is coupled to the memory cells 131-136, where the circuitry 140 includes the support circuitry used to store data values in the memory cells 131-136. In some embodiments, the circuitry 140 includes oversized transistors that have greater current-carrying capacity and are therefore capable of allowing sufficient current to be sent through the memory cells 131-136 such that the a "breakdown voltage" is dropped across the magnetic tunnel junctions in the memory cells and the dielectric layer included in magnetic tunnel junctions of such cells can be broken down. Such a high-magnitude current is referred to herein as a "breakdown current." In other embodiments, circuitry 140 may include circuitry for coupling a set of select transistors in parallel in order to allow a portion of the overall current flow through a selected memory device to be sent through each select transistor in the set, where the total current flow is the sum of that flowing through each select transistor in the set. The input 141 may correspond to the breakdown current or voltage supply supplied by a tester or other entity to cause the magnetic tunnel junctions in select memory devices within the array 130 of memory devices 131-136 to be broken down.

As shown in FIG. 1, each of the arrays 110 and 130 includes a plurality of magnetic memory cells. In some embodiments, each of the memory cells 131-136 in the array 130 includes a corresponding select transistor, where such select transistors can be considered part of each memory cell in the array 130 or considered part of the circuitry 140. Such a single-transistor-single-magnetic tunnel junction (1T1MTJ) embodiment corresponds to conventional magnetic memory arrays in which each memory cell includes a select transistor and magnetic tunnel junction where the select transistors allow each magnetic tunnel junction to be individually accessed. In the array 110 that includes memory cells 121-126 used to stored data during normal operations using normal programming currents, the resistance difference between the magnetic tunnel junction with the free portion in the first state and the magnetic tunnel junction with the free portion in the second state may be relatively small. For example, the resistance change may be on the order of 10%. As such, accurate measurement of changes in resistance are important to being able to correctly determine the data stored therein. Having individual select transistors in each memory cell such that individual magnetic tunnel junctions can be selected and accessed helps to ensure accurate read operations.

Figure 2:
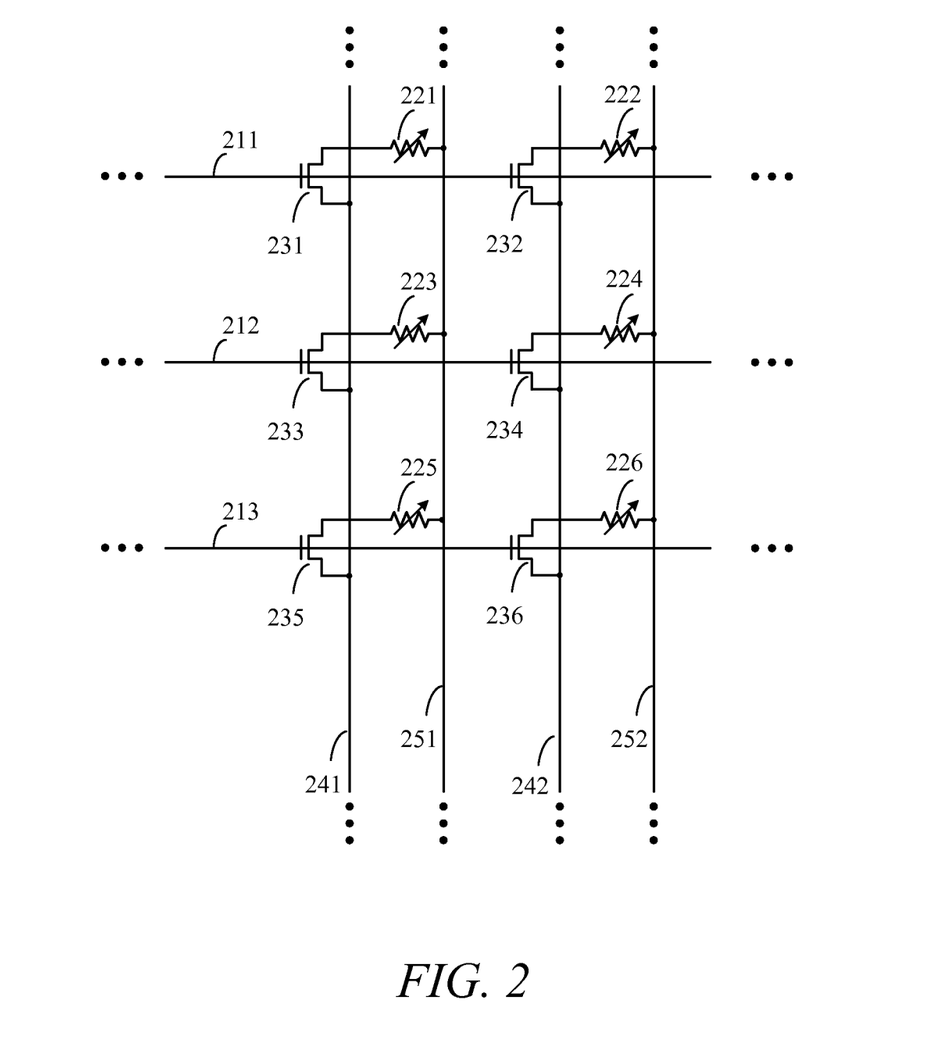
FIG. 2 is a block diagram of a portion of a magnetoresistive memory that includes a select device for each magnetic memory cell in accordance with an exemplary embodiment.

Such an architecture is illustrated in FIG. 2, where each of magnetic tunnel junctions 221-226 is coupled to a corresponding select transistor 231-236. Word lines 211-213 allow for rows of select transistors to be selected. For example, asserting word line 211 turns on select transistors 231 and 232. Bit lines 241-242 and source lines 251-252 can then be driven in order to cause read and write currents to flow through individual memory cells. For example, if word line 211 is driven, current can be made to flow in magnetic tunnel junction 221 by driving the appropriate voltages on bit line 241 and source line 251. If no current is intended to flow through magnetic tunnel junction 222, then bit line 242 and source line 252 can be biased at a similar voltage.

In embodiments where each of the high-temperature tolerant memory cells 131-136 includes a corresponding select transistor, each of those transistors may be sized differently than transistors included in the array 110 corresponding to memory cells 121-126. For example, the select transistors for the array 130 may be larger in order to have the current-carrying capacity needed to support programming operations for the memory cells 131-136 during which the dielectric layers of some of those memory cells are caused to break down.

Figure 3:
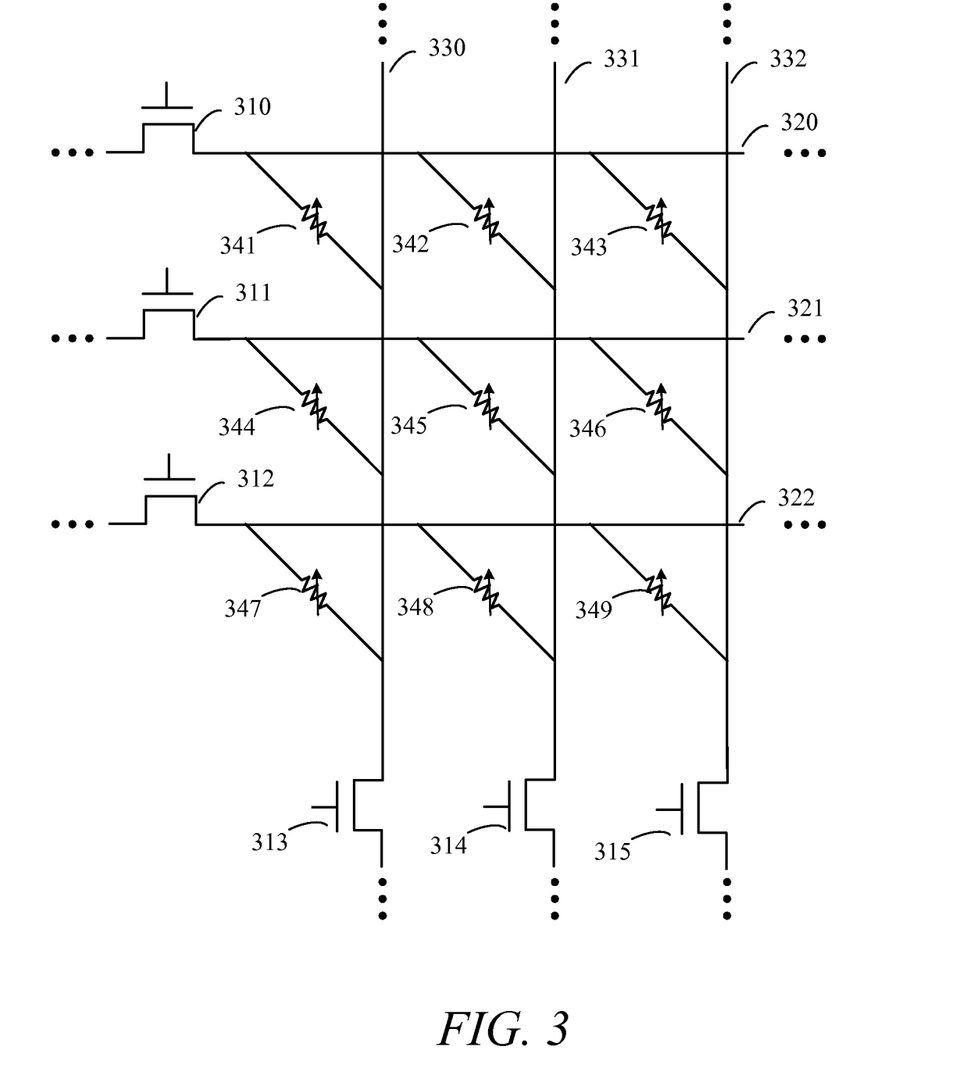
FIG. 3 is a block diagram of a portion of a magnetoresistive memory that includes magnetic memory cells arranged in a cross-point array in accordance with an exemplary embodiment.

Because larger transistors may be needed to support the breakdown current required to achieve the breakdown voltage drop across the magnetic tunnel junctions used to program the memory cells 131-136, it may be beneficial to use a different architecture for selecting individual magnetic tunnel junctions for access in the array 130. Turning to FIG. 3, a cross-point array that includes magnetic tunnel junctions 341-349 is illustrated. In the embodiment of FIG. 3, each magnetic tunnel junction 341-349 can be considered as a memory cell, wherein shared transistors 310-315, which may be referred to as select transistors, are used to select the magnetic tunnel junction to be access and enable the current flow needed to read and write from the individual memory cells. As shown, each of the select transistors 310-315 is capable of driving one of the horizontal signal lines 320-322 or one of the vertical signal 330-332 to cause current to flow through one or more of the magnetic tunnel junctions 341-349. For example, magnetic tunnel junction 341 can be accessed by driving horizontal line 320 using select transistor 310 and driving vertical line 330 using select transistor 313. Sneak paths in the circuitry that result in leakage currents may make such cross-point array architectures impractical for normal memory cell arrays in which the resistance differential between stored states is only on the order of 10-100%. In other words, because the resistance difference between a convention memory cell storing the first state and the same cell storing the second state is only on the order of 10-100%, and the resistance varies from cell to cell within the array, it may be hard to distinguish the state stored in the memory cell when sneak paths allow for leakage. However, in arrays such as array 130 in which the resistance differential between a memory cell with an intact magnetic tunnel junction and one with a broken-down magnetic tunnel junction is much greater, the leakage paths are of less consequence. As such, the cross-point array architecture can provide individual memory cell access without many fewer transistors. This is of particular value when the transistors need to be oversized to accommodate additional current flow as only one transistor is needed for each vertical and horizontal signal line rather than a select transistor for each and every memory cell in the array. Fewer transistors results in increased magnetic memory device density.

Returning to FIG. 1, memory access circuitry 150 is used to determine the data stored in the memory cells 121-126 and 131-136 as well as being used to store data in the memory cells 121-126 using conventional programming techniques. In some embodiments, the memory access circuitry 150 includes one read circuit that is capable of determining the data stored in both sets of memory cells 121-126 and 131-136. In other embodiments, the memory access circuitry 150 includes a first read circuit coupled to the first plurality of magnetic memory cells 121-126 and a second read circuit coupled to the second plurality of magnetic memory cells 131-136, where each read circuit is adapted to read the data in the respective sets of memory cells. Thus, the same circuitry and techniques can be used to determine the data stored in the memory cells 121-126 and 131-136 or different circuitry and techniques can be used.

For example, because the resistance differential between states for the memory cells 121-126 may be on the order of 10%, a self-referenced read operation may be used to determine the data states stored in those memory cells. Such self-referenced read techniques include sensing the resistance of the memory cell, storing a known state in the memory cell, sensing the resistance of the memory cell in the known state, and then comparing the second sensing operation with the first sensing operation to see if the resistance has changed or not. If relatively no change occurs, the memory cell originally stored the known state written during the self-referenced read and nothing changed when the memory cell was written to the known state. If there is a change in resistance, then the memory cell originally stored the state opposite that of the known state written during the self-referenced read operation. Such self-referenced read operations are particularly useful when the average resistance through a magnetic memory cell can vary across an integrated circuit, thereby making a comparison of that resistance to a fixed reference less reliable in accurately determining the data states for all of the memory cells on the integrated circuit.

Because the resistance differential in the memory cells 131-136 is much greater than that of the memory cells 121-126, it may not be necessary to use a self-referenced read operation to determine the data states stored in the memory cells 131-136. Instead, a reference 170 may be provided to the read circuit corresponding to the memory cells 131-136, where the reference represents, for example, a mid-point resistance half-way between the resistance of a memory cell with an intact tunnel junction and a memory device in which the dielectric layer has broken down. Because the difference in resistance between these two states is much greater than the 10-100% differential that may be the case for conventionally programmed memory cells, using a reference to determine the state of each memory cell can be effective while also being simpler and faster than a self-referenced read operation.

Notably, in many embodiments, the data stored in memory cells 131-136 may represent "start-up" data used by the system in which the integrated circuit 100 is included. As such, the memory access circuitry may initially copy the data stored in memory cells 131-136 into memory cells 121-126 for use by the system in which the circuit 100 is included. For example, the data stored in memory cells 131-136 may include start-up parameters to be assigned to certain variables to get a system up and running. Those parameters can later be changed by overwriting the values in the memory cells 121-126. As another example, a first version of software for the system can be included in the memory cells 131-136 that is initially copied into memory cells 121-126 or copied into other storage that is included on the integrated circuit or in the system including the integrated circuit. Updates to that software can later be loaded by overwriting the data in that other storage, while the original version remains in the memory cells 131-136.

Figure 4:
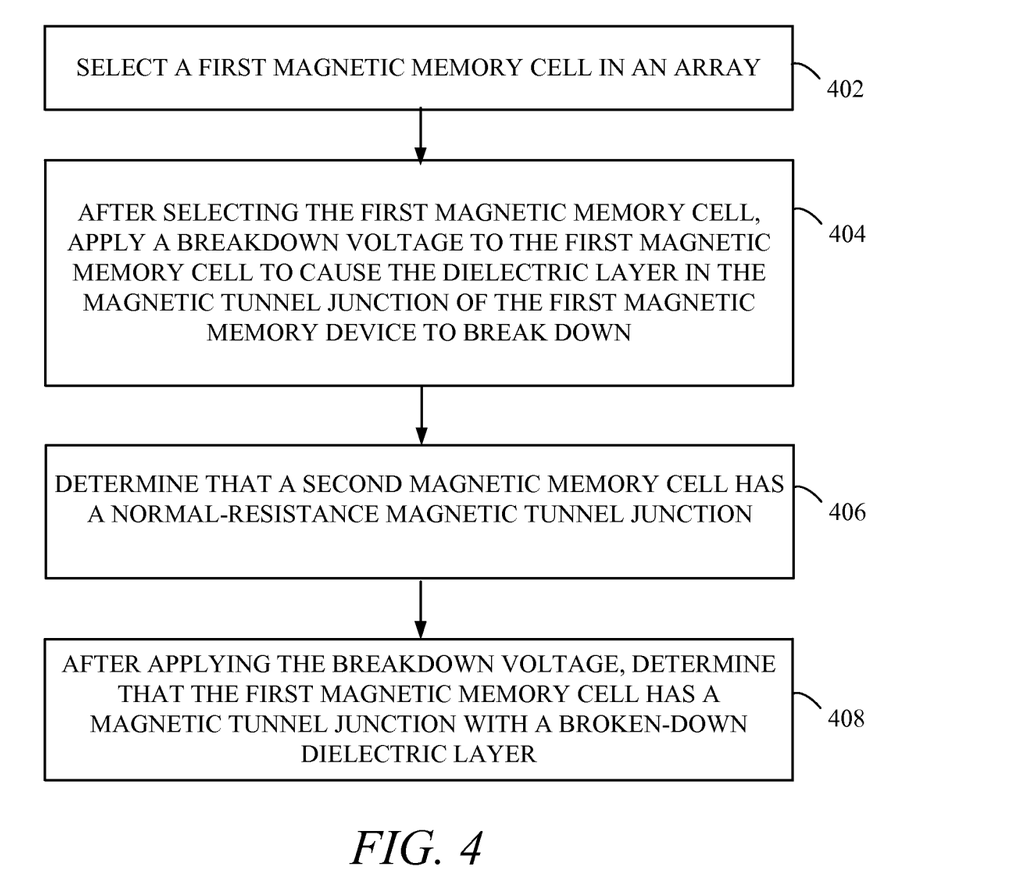
FIG. 4 is a flow chart of a method for storing data in a magnetic memory cell in accordance with an exemplary embodiment.
Figure 5:
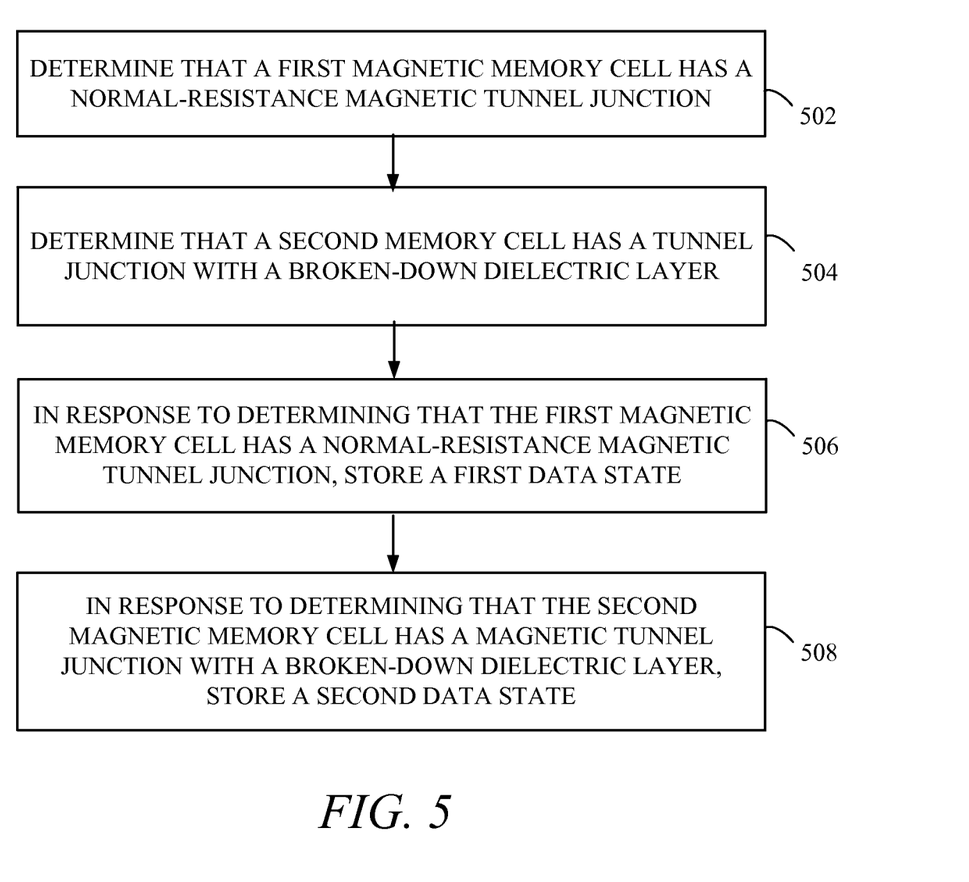
FIG. 5 is a flow chart of a method for reading data from magnetic memory cells in accordance with an exemplary embodiment.

FIGS. 4 and 5 are flow charts that illustrate exemplary embodiments of methods of programming and reading from magnetic memory cells that are tolerant of exposure to high-temperatures or external magnetic fields. The operations included in the flow charts may represent only a portion of the overall process used in testing/configuring the memory. For illustrative purposes, the following description of the methods in FIGS. 4 and 5 may refer to elements mentioned above in connection with FIGS. 1-3. It should be appreciated that methods may include any number of additional or alternative tasks, the tasks shown in FIGS. 4 and 5 need not be performed in the illustrated order unless specified otherwise, and the methods may be incorporated into a more comprehensive procedure or process having additional functionality not described in detail herein. Moreover, one or more of the tasks shown in FIGS. 4 and 5 can be omitted from an embodiment as long as the intended overall functionality remains intact FIG. 4 illustrates a flow diagram corresponding to a method for storing data in a magnetic memory device. In some embodiments, the magnetic memory device is an integrated circuit device that includes magnetic memory cells as well as other circuits that use the data stored and retrieved from the magnetic memory cells. In other embodiments, the magnetic memory device is a memory chip whose primary purpose is data storage. In some embodiments, the magnetic memory device includes a first plurality of memory cells (which may be magnetic memory cells or other memory cells such as SRAM or DRAM) that are used for normal read and write operations as well as a second plurality of memory cells that are magnetic memory cells in which data is stored based on the presence or absence of a functional tunnel junction. One example of such an embodiment is illustrated in FIG. 1.

The method of FIG. 4 provides one example of a set of operations that are used to store the desired states in the magnetic memory cells. As noted above, such memory cells can be used as one-time programmable memory cells that are able to store data reliably even when exposed to high temperature operations such as wave-soldering. For example, while normal operating conditions may expose the devices to temperatures in the 40-150° C. range, wave-soldering may expose a device to 265° C. for several minutes. In some embodiments, the method of FIG. 4 is performed during wafer probing, whereas in other embodiments it may be performed at other points in time during manufacturing or testing of the memory device.

At 402 a first magnetic memory cell in the array of magnetic memory cells is selected for programming. Each magnetic memory cell in the array of magnetic memory cells includes a magnetic tunnel junction that includes a dielectric layer that serves as a tunnel barrier. Selection at 402 may include providing or decoding an address to select one or more magnetic memory cells in the array. As discussed above, in some embodiments, the memory cells are selected based on the 1T1MTJ architecture, whereas in other embodiments, the magnetic memory cells are included in a cross-point array.

At 404, after the first magnetic memory cell has been selected, a breakdown voltage is applied to the first magnetic memory cell to cause the dielectric layer in the magnetic tunnel junction of the first magnetic memory cell to break down. Absent the application of other stimuli that reduce the breakdown characteristics of the magnetic memory cell, the breakdown voltage is greater in magnitude than a voltage used for storing data in a magnetic memory cell during normal operation. As discussed above, applying the breakdown voltage can include using a select transistor to pass the breakdown current where the select transistor may be an oversized select transistor in comparison with those select transistors associated with magnetic memory cells used for data storage and retrieval in normal device operation. The oversized select transistor has sufficient current-carrying capacity to carry the breakdown current applied to the first magnetic memory cell. Thus, applying the breakdown voltage to the first magnetic memory cell includes driving the gate of a select transistor coupled to the first magnetic memory cell, wherein the select transistor has sufficient current-carrying capacity to carry the breakdown current for the breakdown voltage applied to the first magnetic memory cell. In other embodiments, applying the breakdown voltage can include selectively coupling a plurality of select transistors together to allow for sufficient current to be applied to the first magnetic memory device in order to reach the breakdown voltage of the dielectric tunnel barrier layer.

In some embodiments, applying the breakdown voltage is done by a tester during wafer probe. Performing the programming at wafer probe provides some additional stimulus that can be applied to the magnetic memory device that may not be as easily applied during normal operation. Such additional stimulus can be used to increase the susceptibility of the dielectric layer to breakdown such that less current or less voltage needs to be applied to cause the dielectric layer to breakdown. In one embodiment, the magnetic memory device may be exposed to an external magnetic field that makes the memory cells more susceptible to breakdown. For example, the magnetic field can force the free portion of the magnetic memory cells into the higher-resistance state with respect to the fixed portion such that more voltage is dropped across the magnetic tunnel junction for a particular current. In another embodiment the magnetic memory device is exposed to a heat source to elevate the temperature of MTJs above a normal operating temperature range. For example, the chuck upon which the wafer sits during testing can be heated, which may result in the magnetic tunnel junctions being more susceptible to breaking down. The testing environment of wafer probe also provides for different voltages that can be applied to the magnetic memory device, where those voltages may be much greater in magnitude than those available when the memory device is included in a functional system. Such higher voltages may be used to cause the dielectric layer to breakdown without having any long-term impact on the selection transistors or other components on the memory device because the voltages are only applied once during the lifetime of the part. In yet other embodiments, combinations of heat, external magnetic fields, higher voltages, and other tools available at wafer probe are used to enhance the programmability of the magnetic memory device.

After the first magnetic memory cell is programmed to a first state by causing the dielectric layer in its magnetic tunnel junction to breakdown, verification of the data states stored in the magnetic memory device can be performed to ensure that the desired data values have been stored. At 406 it is determined that a second magnetic memory cell has a magnetic tunnel junction with normal resistance (i.e. that corresponding to an MTJ having a dielectric layer that has not broken down). In one example, if a magnetic memory cell that includes a broken-down magnetic tunnel junction is used to store a binary "0," a magnetic memory cell that is left with a magnetic tunnel junction with normal resistance stores a binary "1." As such, the second magnetic memory cell, which has a normal-resistance magnetic tunnel junction, stores a binary "1" in this example. As discussed earlier, the presence or absence of a functional magnetic tunnel junction can be determined by measuring the resistance across the magnetic memory cell. A near-zero or very low resistance corresponds to a broken-down magnetic tunnel junction, whereas a normal resistance corresponds to a functional magnetic tunnel junction in which the dielectric layer has not been broken down. As discussed above, comparing the resistance of the magnetic memory cell with a reference value can be used to determine whether or not the magnetic memory cell includes a normal-resistance tunnel junction.

At 408, it is determined that first magnetic memory cell has a broken-down dielectric layer and does not include a normal-resistance magnetic tunnel junction. Thus the programming operation performed at 404 is verified to confirm the effectiveness of the breakdown voltage applied. The resistance of the first magnetic memory cell will be significantly less than the second magnetic memory cell because of the broken-down dielectric layer. In the example, where the second magnetic memory cell stores a binary "1," the first magnetic memory cell stores a binary "0" based on its broken-down dielectric layer in its tunnel junction. By selectively leaving some magnetic memory cells with intact magnetic tunnel junctions while intentionally breaking down the dielectric layers in other magnetic tunnel junctions, data can be stored in the memory cells during testing where that data is not susceptible to degradation as a result of exposure to magnetic fields or heat in subsequent operations.

FIG. 5 illustrates a flow diagram of a method for recovering or reading data from magnetic memory cells such as the magnetic memory cells 131-136 illustrated in FIG. 1 above. At 502 it is determined that a first magnetic memory cell has a normal-resistance magnetic tunnel junction. Such a determination can be made by comparing the resistance of the first magnetic memory cell with a reference. The presence of a normal-resistance magnetic tunnel junction corresponds to the storage of a first state in the magnetic memory cell. At 504 it is determined that a second magnetic memory cell has a tunnel junction with a broken-down dielectric layer. Such a determination can be made by comparing the resistance of the second magnetic memory cell with the reference. The reference can be chosen to represent a resistance between the resistance of a magnetic memory cell with a tunnel junction having a broken-down dielectric layer and the resistance of a magnetic memory cell with a normal-resistance magnetic tunnel junction. In such an embodiments, the first magnetic memory cell has a resistance greater than the reference, whereas the second magnetic memory cell has a resistance less than the reference.

At 506 a first data state is stored in response to determining that the first magnetic memory cell has a normal-resistance magnetic tunnel junction. Thus, in this embodiment, normal-resistance magnetic tunnel junctions are used to store the first data state. When it is determining that a memory cell has a normal-resistance magnetic tunnel junction and therefore stores the first data state, the first data state can be stored elsewhere on the integrated circuit device. For example, in an embodiment similar to that illustrate in FIG. 1, when it is determined that the magnetic memory cell 131 has a normal-resistance magnetic tunnel junction and therefore stores the first data state, that data can be copied over into the array 110 for use during normal operation. In other embodiments the data state can be copied into a register on the integrated circuit device, some other non-magnetic memory on the integrated circuit device, or output on a signal line to another circuit external to the integrated circuit device.

At 508 a second data state is stored in response to determining that the first magnetic memory cell has a tunnel junction with a broken-down dielectric layer. In this embodiment, a magnetic tunnel junction with a broken-down dielectric layer is used to store the second data state. When it is determined that a memory cell has a magnetic tunnel junction with a broken-down dielectric layer and therefore stores the second data state, that data state can be stored elsewhere on the integrated circuit device, used directly by circuitry on the integrated circuit, or output to another circuit.

In an embodiment of FIG. 5 corresponding to FIG. 1, each magnetic memory cell 131-136 can be evaluated to determine whether or not it has a normal-resistance magnetic tunnel junction. The data stored in those magnetic memory cells can then be used or copied into other memory or storage on the integrated circuit device for use in the system in which the integrated circuit device is included. Magnetic memory cells with normal-resistance magnetic tunnel junctions represent a first data state (e.g. binary "0"), whereas magnetic memory cells that have magnetic tunnel junctions with broken-down dielectric layers represent a second data state (e.g. binary "1").

By initially storing the data in such magnetic memory cells in such a manner during testing or other manufacturing operations, that data can survive high-temperature soldering operations and/or exposure to strong magnetic fields. Thus, the magnetic memory cells, which are used as anti-fuses to store data, retain that data during operations such as packaging and soldering that expose the magnetic memory cells to high temperatures. Similarly, while strong magnetic fields might disturb data stored in a conventional magnetic memory cell using the orientation of the free layer, such magnetic fields will not change the data values stored in the magnetic memory cells based on the presence/absence of a normal-resistance magnetic tunnel junction as the orientation of the free layer does not impact the data state stored. Thus, using such magnetic memory cells as anti-fuses allows for the storage of program code, security codes, identification numbers, and the like. That information is also tamper-resistant as it can be read out and used by the system even after attempts to tamper with the data using magnetic fields or high temperatures occurs.

Notably, rather than using the magnetic memory cells as anti-fuses where data is stored based on the presence or absence of a normal-resistance magnetic tunnel junction, other embodiments include the use of modified magnetic memory cells that are more resistant to disturbance of their stored data states by heat or magnetic fields. In some embodiments, the memory cells may be larger such that they are less-easily influenced by heat or external magnetic fields. The memory cells may include different materials that change the characteristics of the magnetic memory cells such that they are less easy to program or disturb. Notably, programming the memory cells at wafer probe may provide specific conditions needed to program such non-standard memory cells. For example, a higher voltage or temperature may be required to force the free portion of such memory cells into the desired state. Such conditions, while available during device testing, may be difficult to replicate in a non-testing environment, thereby effectively rendering those memory cells as one-time-programmable.

In yet other embodiments, certain data values may be stored using multiple magnetic tunnel junctions in the memory device, where the data values are determined by the states of all of the magnetic tunnel junctions used to store the data value. In one example, a single binary "1" may be stored using five magnetic tunnel junctions, where each is included in a separate 1T1MTJ memory cell. If the memory cells are borderline in terms of being able to retain their data through certain operations like packaging or soldering, performing a majority determination for the five separate memory cells is likely to reproduce the data value stored as it is unlikely that more than two of the magnetic memory cells would switch to the other state. In another example, memory cells that include multiple magnetic tunnel junctions can be used to store data, where the total resistance through the memory cell is based on the sum of the resistances of the magnetic tunnel junctions. If less than half are likely to switch in response to exposure to high-heat or external magnetic fields of a certain magnitude, a majority determination will still produce the desired result.

Note that in yet other embodiments, combinations of the various techniques and memory cell types used to store data can be used to provide data storage that is robust and can withstand adverse conditions. For example, combinations of anti-fuse magnetic memory cells with larger memory cells or different-composition memory cells can be used where different types of memory cells provide different advantages. Users can select the magnetic memory cells that best suit their applications based on the expected exposure to non-optimal conditions in order to ensure adequate data retention, where different applications may be able to tolerate different levels of data degradation.

While exemplary embodiments have been presented above, it should be appreciated that many variations exist. Furthermore, while the description uses spin-torque MRAM devices in specific examples, the teachings may be applied to other devices having different architectures in which the same concepts can be applied. For example, other magnetic memory devices that have magnetic tunnel junctions (e.g. toggle-MRAM) could be used. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A magnetoresistive memory device, comprising:
   a first plurality of magnetic memory cells configured to store data;
   a second plurality of magnetic memory cells, wherein each magnetic memory cell of the second plurality of magnetic memory cells has reduced breakdown characteristics in comparison with each magnetic memory cell of the first plurality of magnetic memory cells, wherein the second plurality of magnetic memory cells includes:
   intact magnetic memory cells having a normal-resistance magnetic tunnel junction; and
   broken-down magnetic memory cells having a magnetic tunnel junction that includes a dielectric layer that has broken down such that the broken-down magnetic memory cells have a resistance substantially lower than a resistance of the intact magnetic memory cells;

circuitry coupled to the second plurality of memory cells, the circuitry capable of conducting a breakdown current through selected magnetic memory cells of the second plurality of magnetic memory cells, wherein the breakdown current results in a breakdown voltage that breaks down the dielectric layer included in magnetic tunnel junctions of intact magnetic memory cells; and read circuitry coupled to the first and second pluralities of magnetic memory cells.

2. The magnetoresistive memory device of claim 1, wherein the magnetic memory cells in the second plurality of magnetic memory cells have a different size or structure than the magnetic memory cells in the first plurality of magnetic memory cells, wherein the different size or structure makes magnetic tunnel junctions of the magnetic memory cells in the second plurality of magnetic memory cells more susceptible to breakdown than magnetic tunnel junctions of the magnetic memory cells in the first plurality of magnetic memory cells.

3. The magnetoresistive memory device of claim 2, wherein the magnetic memory cells in the second plurality of magnetic memory cells have a different size than the magnetic memory cells in the first plurality of magnetic memory cells.

4. The magnetoresistive memory device of claim 3, wherein the magnetic tunnel junctions in the magnetic memory cells of the second plurality of magnetic memory cells are larger than the magnetic tunnel junctions in magnetic memory cells of the first plurality of magnetic memory cells.

5. The magnetoresistive memory device of claim 1, wherein the magnetic memory cells in the first and second pluralities of magnetic memory cells consist of features formed using common processing steps and materials.

6. The magnetoresistive memory device of claim 1, wherein each magnetic memory cell in the first plurality of magnetic memory cells includes a corresponding select transistor coupled to a magnetic tunnel junction; and wherein the circuitry coupled to the second plurality of memory cells includes a second plurality of select transistors, and wherein each select transistor included in the second plurality of select transistors has greater current-carrying capacity than each select transistor included in the first plurality of magnetic memory cells.

7. The magnetoresistive memory device of claim 1, wherein each magnetic memory cell in the first plurality of magnetic memory cells includes a corresponding select transistor coupled to a magnetic tunnel junction; and wherein the circuitry coupled to the second plurality of memory cells includes a second plurality of select transistors, wherein the circuitry coupled to the second plurality of memory cells includes circuitry for coupling a set of select transistors of the second plurality of select transistors in parallel.

8. The magnetoresistive memory device of claim 1, wherein magnetic tunnel junctions included in the second plurality of magnetic memory cells are arranged in a crosspoint array, and wherein each magnetic memory cells of the first plurality of magnetic memory cells has a corresponding select transistor such that the first plurality of magnetic memory cells is arranged in a single-transistor-single-magnetic tunnel junction architecture.

9. The magnetoresistive memory device of claim 1, wherein the first plurality of magnetic memory cells is in a different array than the second plurality of magnetic memory cells.

10. The magnetoresistive memory device of claim 1, wherein the read circuitry further comprises:

a first read circuit coupled to the first plurality of magnetic memory cells, wherein the first read circuit uses a self-referenced read operation to determine data states in magnetic memory cells of the first plurality of magnetic memory cells; and a second read circuit coupled to the second plurality of magnetic memory cells, wherein the second read circuit uses a mid-point reference to determine data states stored in the second plurality of memory cells.

11. A method for storing data in a magnetoresistive memory device, comprising:

selecting a first magnetic memory cell in an array of magnetic memory cells, wherein each magnetic memory cell in the array includes a magnetic tunnel junction that includes a dielectric layer;

after selecting the first magnetic memory cell, applying a breakdown voltage to the first magnetic memory cell, wherein the breakdown voltage has sufficient magnitude to break down the dielectric layer in the magnetic tunnel junction included in the magnetic memory cell, wherein applying the breakdown voltage further comprises at least one of:

exposing the magnetoresistive memory device to an external magnetic field that makes the dielectric layer in the magnetic tunnel junction of the first magnetic memory cell more susceptible to breakdown;

exposing the magnetoresistive memory device to a heat source to elevate temperature of the first magnetic memory cell above a normal operating temperature range; and generating the breakdown voltage using a voltage greater than voltages used during normal operation of the magnetoresistive memory device;

determining that a second magnetic memory cell in the array of magnetic memory cells has normal-resistance magnetic tunnel junction, wherein the normal-resistance magnetic tunnel junction indicates that the second magnetic memory cell stores a first data value; and after applying the breakdown voltage, determining that the first magnetic memory cell has a magnetic tunnel junction with a broken-down dielectric layer, wherein the broken-down dielectric layer indicates that the first magnetic memory cell stores a second data value that is different than the first data value.

12. The method of claim 11, wherein applying the breakdown voltage to the first magnetic memory cell includes selectively coupling a plurality of transistors in parallel, wherein a breakdown current corresponding to the breakdown voltage travels through the transistors coupled in parallel.

13. The method of claim 11, wherein applying the breakdown voltage to the first magnetic memory cell includes applying the breakdown voltage using a tester, wherein the breakdown voltage is greater in magnitude than voltages available during normal operation.

14. The method of claim 11, wherein applying the breakdown voltage further comprises applying the breakdown voltage using a tester, and wherein applying the breakdown voltage further comprises exposing the magnetoresistive memory device to an external magnetic field that makes the dielectric layer in the magnetic tunnel junction of the first magnetic memory cell more susceptible to breakdown.

15. The method of claim 11, wherein applying the breakdown voltage further comprises applying the breakdown voltage using a tester, and wherein applying the breakdown voltage further comprises exposing the magnetoresistive memory device to a heat source to elevate temperature of the first magnetic memory cell above a normal operating temperature range.

16. A magnetoresistive memory device, comprising:

a first plurality of magnetic memory cells configured to store data;

a first plurality of select transistors, wherein each of the first plurality of select transistors is coupled to a corresponding magnetic memory cell of the first plurality of magnetic memory cells;

a second plurality of magnetic memory cells, wherein the second plurality of magnetic memory cells includes:

intact magnetic memory cells having a normal-resistance magnetic tunnel junction; and broken-down magnetic memory cells having a magnetic tunnel junction that includes a dielectric layer that has broken down such that the broken-down magnetic memory cells have a resistance substantially lower than a resistance of the intact magnetic memory cells;

circuitry coupled to the second plurality of memory cells, the circuitry capable of conducting a breakdown current through selected magnetic memory cells of the second plurality of magnetic memory cells, wherein the breakdown current results in a breakdown voltage that breaks down the dielectric layer included in magnetic tunnel junctions of intact magnetic memory cells, wherein the circuitry includes at least one of:

oversized select transistors coupled to the second plurality of memory cells, wherein the oversized select transistors are capable of carrying more current than select transistors included in the first plurality of select transistors; and circuitry for coupling a set of select transistors in parallel in order to allow a portion of the breakdown current to be sent through each select transistor in the set; and read circuitry coupled to the first and second pluralities of magnetic memory cells.

17. The magnetoresistive memory device of claim 16, wherein the magnetic memory cells in the second plurality of magnetic memory have a different size or structure than the magnetic memory cells in the first plurality of magnetic memory cells, wherein the different size or structure makes magnetic tunnel junctions of the magnetic memory cells in the second plurality of magnetic memory cells more susceptible to breakdown than magnetic tunnel junctions of the magnetic memory cells in the first plurality of magnetic memory cells.

18. The magnetoresistive memory device of claim 16, wherein the magnetic tunnel junctions in the magnetic memory cells of the second plurality of magnetic memory cells are larger than the magnetic tunnel junctions in magnetic memory cells of the first plurality of magnetic memory cells.

19. The magnetoresistive memory device of claim 16, wherein the magnetic memory cells in the first and second pluralities of magnetic memory cells consist of features formed using common processing steps and materials.

20. The magnetoresistive memory device of claim 16, wherein magnetic tunnel junctions included in the second plurality of magnetic memory cells are arranged in a cross-point array.

* * * * *